(12) United States Patent
Neuhauser et al.

(10) Patent No.: US 7,541,600 B2
(45) Date of Patent: Jun. 2, 2009

(54) LITHOGRAPHIC AND MEASUREMENT TECHNIQUES USING THE OPTICAL PROPERTIES OF BIAXIAL CRYSTALS

(75) Inventors: Daniel Neuhauser, Los Angeles, CA (US); Gabriel Y. Sirat, Rehovot (IL)

(73) Assignee: The Regents of the University of California, Oakland, CA (US)

( * ) Notice: Subject to any disclaimer, the term of this patent is extended or adjusted under 35 U.S.C. 154(b) by 484 days.

(21) Appl. No.: 11/488,176

(22) Filed: Jul. 14, 2006

(65) Prior Publication Data
US 2007/0171432 A1 Jul. 26, 2007

Related U.S. Application Data

(60) Provisional application No. 60/728,448, filed on Oct. 19, 2005, provisional application No. 60/700,017, filed on Jul. 15, 2005.

(51) Int. Cl.
*G01J 1/00* (2006.01)
*G01N 21/00* (2006.01)
*G01N 23/00* (2006.01)

(52) U.S. Cl. .............. 250/491.1; 356/614; 356/367; 356/369; 356/364; 356/365; 356/491; 356/330; 356/328; 356/326; 356/348; 356/301; 356/240; 356/281; 359/498; 359/326; 359/316; 372/21; 372/105; 372/106; 372/27; 372/32

(58) Field of Classification Search .............. 250/491.1; 356/614, 367, 369, 364, 365, 491, 330, 328, 356/326, 348, 301, 240, 281; 359/498, 326, 359/316; 372/21, 105, 106, 27, 32
See application file for complete search history.

(56) References Cited

U.S. PATENT DOCUMENTS 7,456,962 B2 * 11/2008 Blum et al. ................. 356/367

OTHER PUBLICATIONS

Adel, M. et al. Optimized overlay metrology marks: Theory and experiment. IEEE Transactions on Semiconductor Manufacturing, vol. 17, No. 2, pp. 166-179, 2004.
Belafhel, A. Theoretical intensity distribution of internal conical refraction. Optics Communications, vol. 178, Nos. 4-6, pp. 257-265, 2000.
Belsky, A.M. et al. Internal conical refraction of light beams in biaxial gyrotropic crystals. Optics Communications, vol. 204, Nos. 1-6, pp. 1-6, 2002.
Belsky, A.M. et al. Internal conical refraction of limited light-beams in 2-axes crystals. Optika I Spektroskopiya, vol. 44, No. 4, pp. 746-751, 1978.
Berry, M.V. Conical diffraction asymptotics: fine structure of Poggendorff rings and axial spike. Journal of Optics A—Pure and Applied Optics, vol. 6, No. 4, pp. 289-300, 2004.

(Continued)

*Primary Examiner*—Jack I Berman
*Assistant Examiner*—Meenakshi S Sahu
(74) *Attorney, Agent, or Firm*—John P. O'Banion

(57) ABSTRACT

A method and apparatus for accurately retrieving the position of an optical feature. The method uses the optical properties of biaxial crystals to conically refract the optical feature and transform the image of the optical feature to a circular ring structure. The position of the optical feature is then calculated by locating a center point associated with the circular ring structure.

27 Claims, 13 Drawing Sheets

OTHER PUBLICATIONS

Berry, M.V. et al. Conical diffraction: Hamiltons's diabolical point at the heart of crystal optics. Submitted to Progress in Optics 2006.

Berry, M.V. et al. Conical diffraction: observations and theory. Proc. R. Soc. A., vol. 462, pp. 1629-1642, 2006.

Boulanger, B. et al. Methodology for optical studies of nonlinear crystals: application to the isomorph familty KTiOPO4, KTiOAsO4, RBTiOAsO4 and CsTiOAsO4. Pure and Applied Optics, vol. 7, No. 2, pp. 239-256, 1998.

Boulanger, B. et al. SHG and internal conical refraction experiments in CsTiOAsO4: Comparison with KTiOPO4 and KTiOAsO4 for 1.32-micrometer Type II SHG. IEEE Journal of Quantum Electronics, vol. 33, No. 6, pp. 945-959, 1997.

Boulanger, B. et al. Spheres and cylinders in parametric nonlinear optics. Optical Materials, vol. 26, No. 4, pp. 459-464, 2004.

Bruckstein, A.M. et al. Design of shapes for precise image registration. IEEE Transactions on Information Theory, vol. 44, No. 7 pp. 3156-3162, 1998.

Chen, X.L. et al. Experimental comparison of off-axis illumination and imaging interferometric lithography. Journal of Vacuum Science and Technology B, vol. 17, No. 3, pp. 921-929, 1999.

Chin, M.K. et al. Design and modeling of waveguide-coupled single-mode microring resonators. Journal of Lightwave Technology, vol. 16, No. 8, pp. 1433-1446, 1998.

Chipman, R.A. et al. Handbook of Optics—Chapter 22: Polarimetry. McGraw-Hill: New York, 1995.

Connors, J.M. et al. High finesse ring resonators made by silver sion-exchange in glass. Journal of Lightwave Technology, vol. 5, No. 12, pp. 1686-1689, 1987.

Dreger, M.A. Optical beam propagation in biaxial crystals. Journal of Optics A—Pure and Applied Optics, vol. 1, No. 5, pp. 601-616, 1999.

Eimerl, D. et al. Deuterated L-arginine phosphate—a new efficient nonlinear crystal. IEEE Journal of Quantum Electronics, vol. 25, No. 2, pp. 179-193, 1989.

Feve, J.P. et al. Experimental-Study of internal and external conical refractions in KTP. Optics Communications, vol. 105, Nos. 3-4, pp. 243-252, 1994.

Fritze, M. et al. 100-nm node lithography with KrF? Optical Microlithography XIV, Proceedings of SPIE, vol. 4346, pp. 191-204, 2001.

Fritze, M. et al. Lithography Part I of a Series: Prospects and challenges of optical RET. Solid State Technology, vol. 46, No. 2, pp. 61-64, 2003.

Frommer, A. et al. In field overlay uncertainty contributors. Metrology, Inspection, and Process Control for Microlithography XIX, San Jose, CA, Proceedings of SPIE, vol. 5752, pp. 51-58 2005.

Haertle, D. et al. Refractive indicies of Sn2P2S6 at visible and infrared wavelengths. Optics Express, vol. 13, No. 6, pp. 2047-2057, 2005.

Hamilton, W.R. Third supplement to an essay on the theory of systems of rays. Trans. Royal Irish Acad., vol. 17, part 1, pp. 1-144, 1837.

Hansson, G. et al. Transmission measurements of KTP and isomorphic compounds. Applied Optics, vol. 39, No. 27, pp. 5058-5069, 2000.

Hellstrom, J. et al. Optical parametric amplification in eriodically poled KTiOPO4 seeded by an Er-Yb : glass microchip laser. Optics Letters, vol. 26, No. 6, pp. 352-354, 2001.

Hierle, R. et al. Growth and characterization of a new material for nonlinear optics—methyl-3-nitro-4-pyridine-1-oxide (POM). Journal of Crystal Growth, vol. 69, Nos. 2-3, pp. 545-554, 1984.

International Technology Roadmap for Semiconductors, 2004 Update, Metrology. 19 pp., 2004.

International Technology Roadmap for Semiconductors, 2004 Update, Lithography. 28 pp., 2004.

Isaenko, L. et al. Growth and characterization of LiInS2 single crystals. Journal of Crystal Growth, vol. 218, Nos. 2-4, pp. 313-322, 2000.

Jinbo, H. et al. Improvement of phase-shifter edge line mask method. Japanese Journal of Applied Physics Part 1—Regular Papers, Short Notes, and Review Papers, vol. 30, No. 11B, pp. 2998-3003, 1991.

Kaminskii, A.A. et al. Monocrystalline 2-adamantylamino-5-nirtopyridine (AANP)—a novel organic material for laser Raman converters in the visible and near-IR. Japanese Journal of Applied Physics Part 2—Letters, vol. 41, No. 6A, pp. L603-L605, 2002.

Kamon, K. et al. Photolithography system using annular illumination. Japanese Journal of Applied Physics Part 1—Regular Papers, Short Notes, and Review Papers, vol. 30, No. 11B, pp. 3021-3029, 1991.

Kazak, N.S. et al. Forming annular and Bessel light beams under conditions of internal conical refraction. Journal of Optical Technology, vol. 67, No. 12, pp. 1064-1067, 2000.

King, T.A. et al. Formation of higher-order Bessel light beams in biaxial crystals. Optics Communications, vol. 187, pp. 407-414, 2001.

Ledoux, I. et al. Linear and nonlinear optical-properties of N-4-nitrophenyl L-prolinol single-crystals. Optics Communications, vol. 80, No. 2, pp. 149-154, 1990.

Levenson, M.D. et al. Improving resolution in photolithography with a phase-shifting mask. IEEE Transactions on Electron Devices, vol. 29, No. 12, pp. 1828-1836, 1982.

Levenson, M.D. et al. The phase-shifting mask. II. Imaging simulations and submicrometer resist exposures. IEEE Transactions on Electron Devices, vol. 31, No. 6, pp. 753-763, 1984.

Levenson, M.D. Extending the lifetime of optical lithography technologies with wave-front engineering. Japanese Journal of Applied Physics Part 1—Regular Papers, Short Notes, and Review Papers, vol. 33, No. 12B, pp. 6765-6773, 1994.

Li, L.X. et al. Growth and spectra of YCOB and Nd : YCOB crystals. Crystal Research and Technology, vol. 35, pp. 1361-1371, 2000.

Lloyd, H. On the phenomena presented by light in its passage along the axes of biaxial crystals. The London and Edinburgh Philosophical Magazine and Journal of Science, vol. 2, pp. 207-210, 1833.

Meier, U. et al. DAST—A high optical nonlinearity organic crystal. Synthetic Metals, vol. 109, Nos. 1-3, pp. 19-22, 2000.

O'Gorman, L. Subpixel registration using a concentric ring fiducial. Proceedings of the 10th Internation Conference on Pattern Recognition, Atlantic City, NJ, vol. 2, pp. 249-253, Jun. 16-21, 1990.

Pollentier, I. et al. Thinking outside the box for improved overlay metrology. Yield Management Solutions Magazine, vol. 5, No. 2, pp. 12-16, 2003.

Pujol, M.C. et al. Crystal growth and spectroscopic characterization of Tm3+-doped KYb(WO4)(2) single crystals. Physical Review B, vol. 66, No. 14, 2002.

Pujol, M.C. et al. Growth, optical characterization, and laser operation of a stoichiometric crystal KYb(WO4)(2). Physical Review B, vol. 65, No. 6, 2002.

Raman, C.V. et al. Conical refraction in naphthalene crystals. Nature, vol. 147, pp. 221-227, 1941.

Schell, A.J. et al. 2nd harmonic conical refraction. Optics Communications, vol. 21, No. 1, pp. 150-153, 1977.

Schell, A.J. et al. Laser studies of internal conical diffraction. III. 2nd-harmonic conical refraction in alpha-iodic acid. Physical Review A, vol. 18, No. 6, pp. 2592-2602, 1978.

Schellenberg, F.M. A history of resolution enhancement technology. Optical Review, vol. 12, No. 2, pp. 83-89, 2005.

Segonds, P. et al. Linear and nonlinear optical properties of the monoclinic Ca4YO(BO3)(3) crystal. Journal of the Optical Society of America B—Optical Physics, vol. 21, No. 4, pp. 765-769, 2004.

Seligson, J.L. et al. Overlay metrology simulation: Analytical and experimental validations. Metrology, Inspection, and Process Control for Microlithography XVII, Santa Clara, CA, Proceedings of SPIE, vol. 5038, pp. 61-69, 2003.

Seligson, J.L. et al. Target noise in overlay metrology. Metrology, Inspection, and Process Control for Microlithography XVIII, Santa Clara, CA, Proceedings of SPIE, vol. 5375, pp. 403-412, 2004.

Sematech, Sematech identifies top technical challenges for 2006; Adds Transistor Scaling, Apr. 19, 2005, available at http://www.sematech.org/corporate/news/releases/20050418.htm.

Shih, H. et al. Conical refraction in second-harmonic generation. Physical Review, vol. 184, No. 3, pp. 895-904, 1969.

Sithambaranathan, G.S. et al. Transmission of a Gaussian beam into a biaxial crystal. Journal of the Optical Society of America A—Optics Image Science and Vision, vol. 18, No. 7, pp. 1670-1677, 2001.

Tomaru, S. et al. Nonlinear optical properties of 2-adamantylamino-5-nitropyridine crystals. Applied Physics Letters, vol. 58, No. 23, pp. 2583-2585, 1991.

Ueno, A. et al. Novel at-design-rule via-to-metal overlay metrology for 193-nm lithography. IEEE Transactions on Semiconductor Manufacturing, vol. 17, No. 3, pp. 311-316, 2004.

Warnick, K.F. et al. Secondary dark rings of internal conical refraction. Physical Review E, vol. 55, No. 5, pp. 6092-6096, 1997.

Xu, Q.F. et al. Micrometre-scale silicon electro-optic modulator. Nature, vol. 435, pp. 325-327, 2005.

* cited by examiner

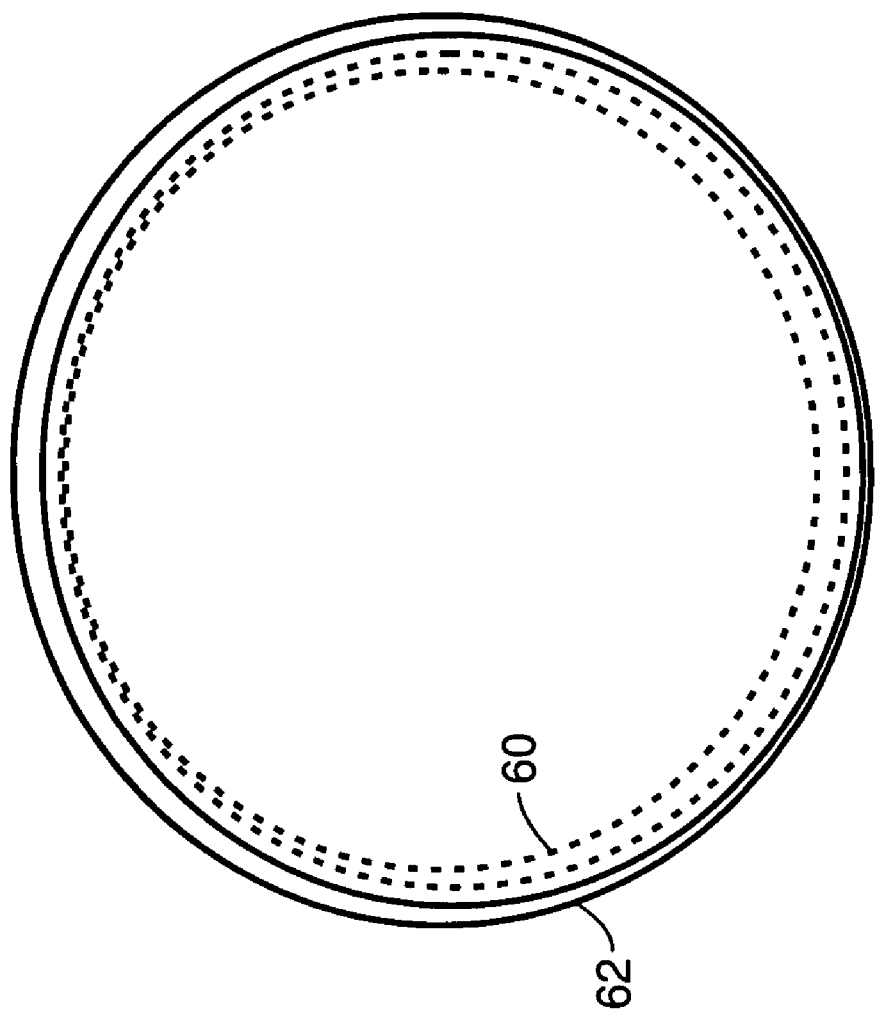

LITHOGRAPHIC AND MEASUREMENT TECHNIQUES USING THE OPTICAL PROPERTIES OF BIAXIAL CRYSTALS

CROSS-REFERENCE TO RELATED APPLICATIONS

This application claims priority from U.S. provisional application Ser. No. 60/728,448, filed on Oct. 19, 2005, incorporated herein by reference in its entirety, and U.S. provisional application Ser. No. 60/700,017, filed on Jul. 15, 2005, incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

This invention pertains generally to lithography, microscopy and overlay methods. More particularly, it relates to application of the filtering and discriminating properties of biaxial crystals in microscopy, overlay, lithography of ring shapes and contact holes, lithographic illumination systems, and related fields.

2. Description of Related Art

Many scientific and industrial applications may be reduced to the fundamental optical problem of detecting a light point and measuring its lateral position. In many cases, a large background is superimposed on the feature to be detected.

Optical technologies are spread in numerous domains, including Lithography, Microscopy, Telecoms and Astronomy to name only a few. However, despite the broad array of applications, only a relatively small number of generic effects are available. An engineering tool using unique effects in light propagation may therefore open new avenues for devices in any of the derived applications and domains.

Conical refraction, light propagation in biaxial crystals along an optical axis, is a well known phenomenon that dates back a number of years. However, it does not have applications in modern technologies, as only recently suitable crystals with large conical effects have been developed (Berry, M. V., *Conical diffraction asymptotics: fine structure of Poggendorff rings and axial spike*. Journal Of Optics A-Pure And Applied Optics, 2004. 6(4): p. 289-300, incorporated herein by reference in its entirety).

Automated microscopy systems perform automatic identification, counting and position measurements of microscopic objects. The object may be a single point or a simple geometrical pattern. It may emit light or be a physical feature which affects the absorption, amplitude or phase of a transmitted, reflected or diffracted light. Some examples are fluorescent markers which are light self-emitting single points and fiducial cross marks on a semiconductor wafer which are phase lithographic features.

Several methods are known to retrieve the spatial position of one or several optical features. These methods translate the object's 2D light distribution into a two-dimensional pattern imaged on a CCD sensor. Adaptive algorithms turn the digitized image into a 2D pattern.

The simplest and most prevalent method is the direct imaging of the feature and the use of machine vision algorithms to retrieve the position. However, diffraction limits and the lack of field depth restrict the measurable volume.

Three general types of optical microscopes are used in science and industry.

Imaging microscopes—either brightfield or darkfield—image the object intensity with high magnification on a detector. In darkfield microscopy, the direct light is blocked and light from the specimen at oblique angles forms a bright image after reflection and diffraction.

Polarization and phase microscopes regroup a large family of microscopes which do not retrieve a direct amplitude image but rather retrieve an enhanced image. The most common types are: phase contrast microscopes and differential interference contrast (DIC) microscopes. Phase contrast microscopy, translates small variations in phase into changes in amplitude. It can be applied to living cells, thin tissue slices and lithographic patterns. Differential interference contrast (DIC) microscopy is a beam-shearing interference system in which the reference beam is sheared by a minuscule amount, generally somewhat less than the diameter of an Airy disk. In reflected light microscopy, optical path differences are created by discontinuities.

Confocal microscopes section the volume into thin slices and retrieve each slice separately. The key to the confocal approach is the use of spatial filtering to eliminate out-of-focus light or flare in specimens that are thicker than the plane of focus. This is done by imaging the object point by point through a pinhole.

Overlay registration refers to the relative alignment of two layers in a thin film photolithographic process. Overlay metrology is a major challenge in Lithography, for any lithographic technique. New solutions have to be developed to meet the stringent requirements of next-level lithography.

Previous methods had relied, up to 130 nm, on incoherent imaging with high magnification of fiducial marks positioned on each one of the layers. The relative position was retrieved using high accuracy machine vision algorithms. One widely used mark is the BiB, the "box in box" mark.

For the latest nodes, several new technologies have been developed. For example, grating marks and diffractive marks have been developed. These marks have been evaluated by manufacturers, selected users, NIST and SEMATECH, and the conclusion is that the main source of uncertainty in the newest technologies is the unmodeled residuals of the process.

Several RET—Resolution Enhanced Techniques—have been developed in order to improve the resolution of Lithographic systems. The major RET techniques are: OPC, optical proximity correction, OAI, (off-axis illumination) and PSM (phase shift masks). OAI, is a standard production tool for resolution enhancement. When the illumination falls on the mask at angles adapted to the pitch of periodic structures in the layout, the imaging characteristics of these periodic features are significantly enhanced. The on-axis components of the image, which do not add contrast, are reduced or eliminated. Another technique, IIL (Imaging Interferometric Lithography), adds a reference through an additional beam.

In general, a uniform wave illuminates a mask with an image of thin features, as lines in the vertical or horizontal direction. The structure, which for simplicity may be a linear grating, creates diffracted orders, at angles depending on the grating spacing. These orders are collected by the lens. At its aperture, or Fourier plane, the DC component and the diffracted orders will be represented by points, with positions proportional to the spatial frequency. We will refer to this plane as the frequency plane. At the frequency plane—or aperture—a physical or virtual stop represents the limit on numerical aperture of the specific lens.

If the diffracted orders are able to pass the stop, the image is reconstructed with adequate details at the image plane. If not, only the DC component is transmitted and a uniform light distribution is created, erasing all spatial information. At the frequency plane, the distance between the DC component and the diffracted orders is proportional to the spatial frequency. High spatial frequencies—very dense features—will extend in the Fourier plane above the stop of the lens and will be lost, or will necessitate a higher Numerical Aperture lens. In on-axis illumination, the DC component passes at the center of the stop and the diffracted orders are located symmetrically at $\pm(fx,fy)$, with fx and fy being the spatial frequencies of the pattern.

By tilting the illuminated wave, OAI, Off-Axis Illumination, translates the angle of the DC component, and its position in the frequency plane as well as the angle of the diffracted orders by the same amount. In the Fourier plane the points representing the diffracted orders are shifted by an amount equal to the off-axis angle multiplied by the lens focal length. Due to the inherent quadracity of the intensity, the image can be reconstructed with high fidelity using the DC component and a single diffracted order, even if the conjugate order had been lost.

OAI permits to cover a much larger range of spatial frequencies. Its theoretical limit will be at the point that the DC component is at one edge of the Fourier plane domain and the diffracted order is at the other one, permitting close to double the frequency to be imaged with a given lens.

OAI permits to cover a frequency range centered on an off-axis point (gx,gy) with gx and gy being the spatial frequencies representing the off axis angle. Several configurations are available for OAI: the main ones are the dipole, the quadrupole, the annular aperture-and the quasar. The OAI is limited to angles inside the Numerical Aperture due to the requirement that the DC component will be transmitted in order to provide an interfering term.

Accordingly, an object of the present invention is a new approach to lithographic techniques and overlay registration of semiconductor wafers.

BRIEF SUMMARY OF THE INVENTION

The present invention is a method for accurately retrieving the position of an optical feature. The method uses the optical properties of biaxial crystals to filter optically an image and to spatially discriminate and position small features.

Existing methods rely on regular linear optics. In contrast, however, the present invention is based on singular optics. In practice, this implies that a beam of light is converted to a thin cone, which will be easy to image.

In one embodiment, the present invention performs several functions, including the following:

1. It optically filters the background using an optical set-up simpler than known methods in microscopy, 2. It optically accentuates the position information of a single point by representing it to a thin circle with known radius.

Both of these steps may be performed simultaneously. The above method makes the optical imaging system less dependent on the depth of focus of the optical microscope. It also permits additional optical functionalities such as measurement of the relative position of two spatially separated features, including two concentric circles or a spot and a circle.

The inventive method will have several applications, including the following:

1. In single molecule detection, the method of the present invention increases the resolution of the measurement of the position of a molecule.

2. In automated industrial microscopic systems, the method of the present invention provides higher accuracy in measuring the position or velocity distribution of an ensemble of light points.

3. For wafer alignment, it provides a precise real-time tracking of the position of fiducial marks on the wafer.

4. For semiconductor pattern overlay measurement, it provides a direct and accurate measurement of the relative position of the wafer and the photoresist pattern.

While the primary focus of the invention is its use for microscopy, the invention may be applied in several scientific and industrial areas, such as in semiconductor and other scientific and industrial applications.

According to an aspect of the invention, a method for retrieving the position of an optical feature comprises using optical properties of biaxial crystals to filter optically an image and to spatially discriminate and position small features. According to another aspect of the invention, a method for retrieving the position of an optical feature comprises representing an image of a light point by a circle by using properties of propagation of light in biaxial crystals close to the optical axis.

In one embodiment, the method comprises filtering two-dimensional information to remove background and low frequency components, and transforming a light point into a thin circle, wherein said steps of filtering and transforming are performed simultaneously, and wherein said steps of filtering and transforming are performed optically. In one mode, the step of filtering removes fixed and slowly varying background. In one mode, the step of transforming transforms light input into a pattern for accurate position measurement.

Another aspect of the invention is a method for measuring the position of an optical feature, comprising directing light associated with the optical feature along an axis of a biaxial crystal, conically refracting the light to transform the image of the optical feature to comprise a circular ring structure (e.g. Poggendorff rings), and calculating the position of the optical feature by locating a center point associated with the circular ring structure.

Generally, the transformed image, or Poggendorff ring structure comprises concentrically aligned inner and outer rings that are separated by an intermediate dark ring. Thus, the optical feature is essentially transformed from a single point of light to the circular ring having a predetermined radius In a preferred embodiment, the position of the optical feature is determined by locating a center point of the dark ring.

In another embodiment, the method comprises the step of filtering two-dimensional information remove background and low frequency components. The steps of filtering and transforming may be performed simultaneously, the biaxial crystal acts as a high pass filter to optically filter the information. In addition, the filtering step removes fixed and slowly varying background.

In yet another embodiment, the transformed image comprises a fundamental wave and a vortex wave, wherein the fundamental wave is removed with a circular polarizer to remove the background component from the image.

In a further embodiment, light associated with a second optical feature is directed along the axis of the biaxial crystal. The light of the second optical feature is conically refracted to transform the image of said second optical feature to comprise second circular ring structure. The position of the second optical feature may then be calculated with respect to the first optical feature by locating a center point associated with the second circular ring structure.

The first optical feature may be associated with a first surface, and the second optical feature associated with a second surface, such that the positions of the first optical feature and second optical feature are calculated to determine the location of the first surface with respect to the second surface.

In one embodiment, the first and second surfaces comprise semiconductor layers, such as substrate and photoresist.

In one mode of the present embodiment, the first optical feature comprises a point, and the second optical feature comprises a circle. Alternatively, the first optical feature comprises a first circle, and the second optical feature comprises a second circle larger than the first circle.

Another aspect of the invention is an apparatus for measuring the position of an optical feature. The apparatus has a biaxial crystal positioned such that light associated with the optical feature strikes an input face of the biaxial crystal. The biaxial crystal is configured such that it conically refracts said light along an axis of the biaxial crystal so that the light exits an output face of the biaxial crystal as a circular ring structure (e.g. Poggendorff rings). An observation surface is coupled along an optical path in communication with the output face. The observation surface is configured to allow location of the position of the optical feature by locating a center point associated with the circular ring structure. The observation plane may comprise a microscope objective, detector surface, or similar device.

The biaxial crystal may comprise one or more of the following materials: KTP, POM, BIBO, LAP, LBO, $KNbO_3$, DAST, MBANP, AANP, YCOB and KGW-MDT. Other materials with similar properties known in the art may also be used.

In one embodiment, the optical feature comprises a single light point, and the biaxial crystal is configured to optically accentuate position information the optical feature by transforming a single point of light to the circular ring structure having a predetermined radius.

A high-pass filter may also be disposed in the optical path, wherein the high-pass filter is configured to remove background and low frequency components.

Another aspect of the invention is a lithography system. The system has a laser configured to emit a beam of light along an optical path, an optical element configured to focus the beam to a single point of light, and a biaxial crystal disposed along the optical path. The biaxial crystal is positioned such that an input face of the biaxial crystal coincides with point of light. The crystal conically refracts the light along an axis of the biaxial crystal such that the light exits an output face of the biaxial crystal as a circular ring structure (e.g. Poggendorff rings). A Kohler plane is also disposed along the optical path to receive the exiting circular ring structure.

An imaging lens is may be disposed between the output face and the Kohler plane to reimage the circular ring structure in the Kohler plane. For example, the imaging lens is configured to control the size and shape of the circular ring structure. Additional optical elements, such as an HOE component, may also be disposed between the crystal and Kohler plane.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

Figure 15B:
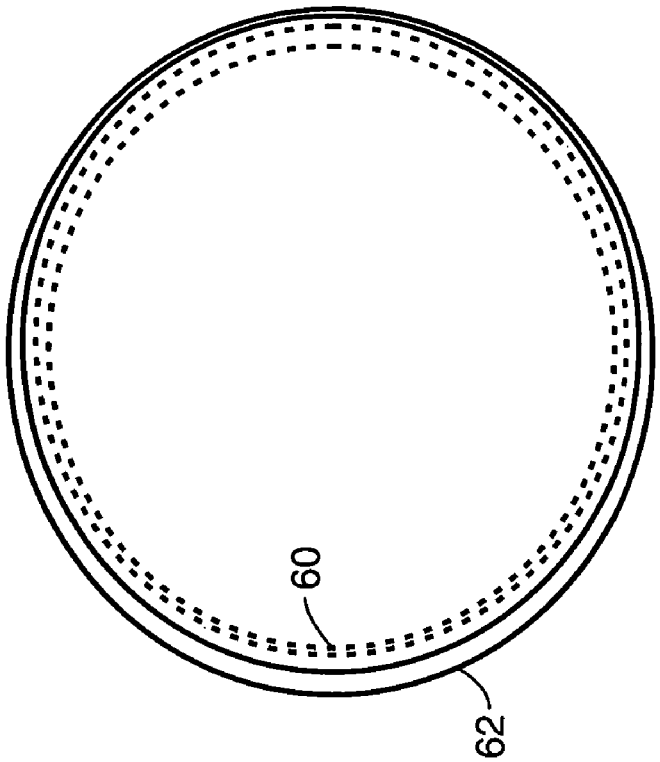
Figure 15A:
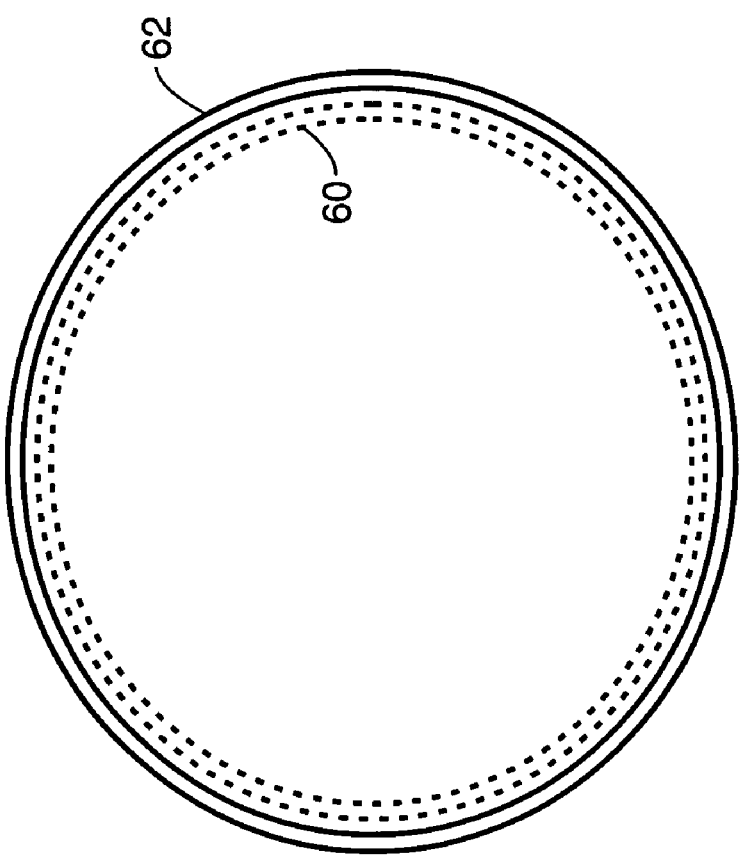

FIGS. 15A-C illustrate the simulation of the superposition of Poggendorff rings of a point and a small circle.

Figure 16:
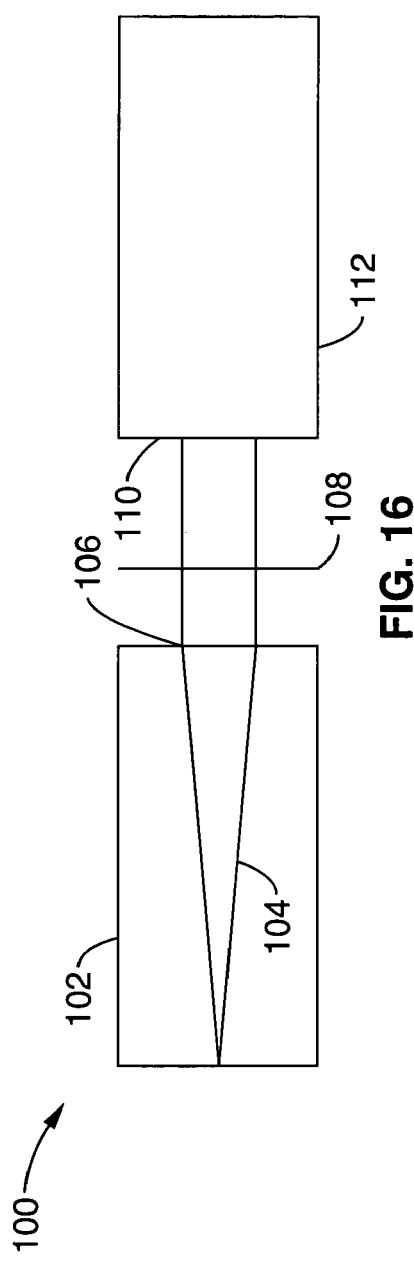

FIG. 16 illustrates a system incorporating two biaxial crystals.

Figure 17:
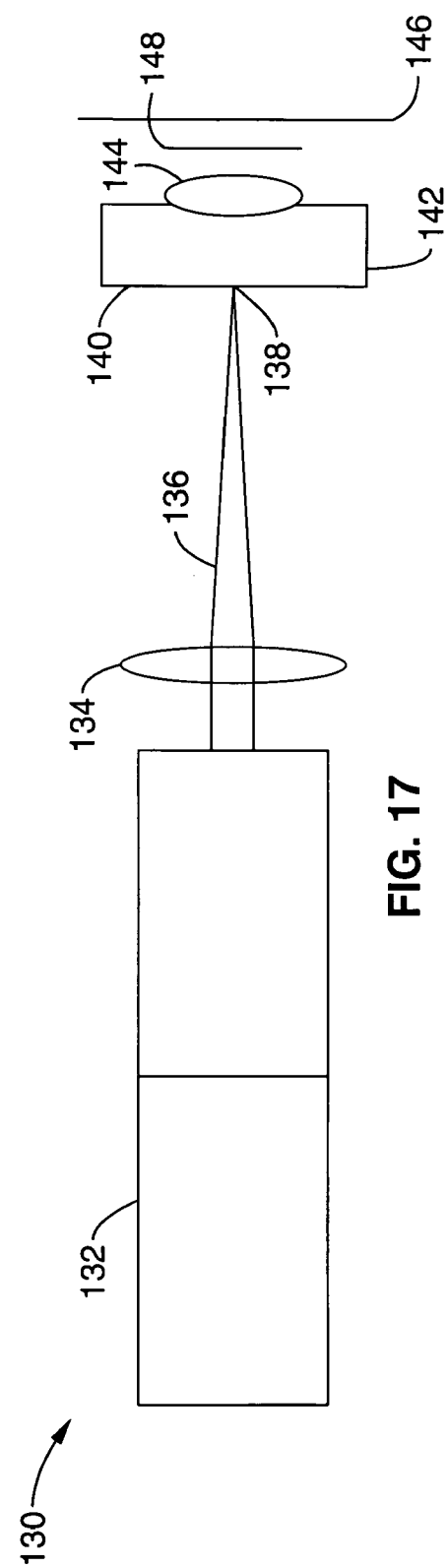

FIG. 17 illustrates a schematic diagram of the Poggendorff lithography system of the present invention.

DETAILED DESCRIPTION OF THE INVENTION

Referring more specifically to the drawings, for illustrative purposes the present invention is embodied in the apparatus generally shown in FIG. 1 through FIG. 17. It will be appreciated that the apparatus may vary as to configuration and as to details of the parts, and that the method may vary as to the specific steps and sequence, without departing from the basic concepts as disclosed herein.

The present invention generally involves a method in which the image of a light point is represented by a circle by using the properties of propagation of light in biaxial crystals close to the optical axis. Theoretically, optical propagation in biaxial crystals is specific due to the existence of a conical singularity (internal conical refraction) and a toroidal ring (external conical refraction) of the dispersion surface, as described in Berry, M. V., previously incorporated by reference. This specificity creates a behavior of the light propagation different from those obtained in any other media; this behavior cannot be fully accounted on by using geometrical optics formalism. In more practical terms, the light propagates in ways different from the normal behavior in other media, opening the way to new effects, methods and devices.

Figure 1:
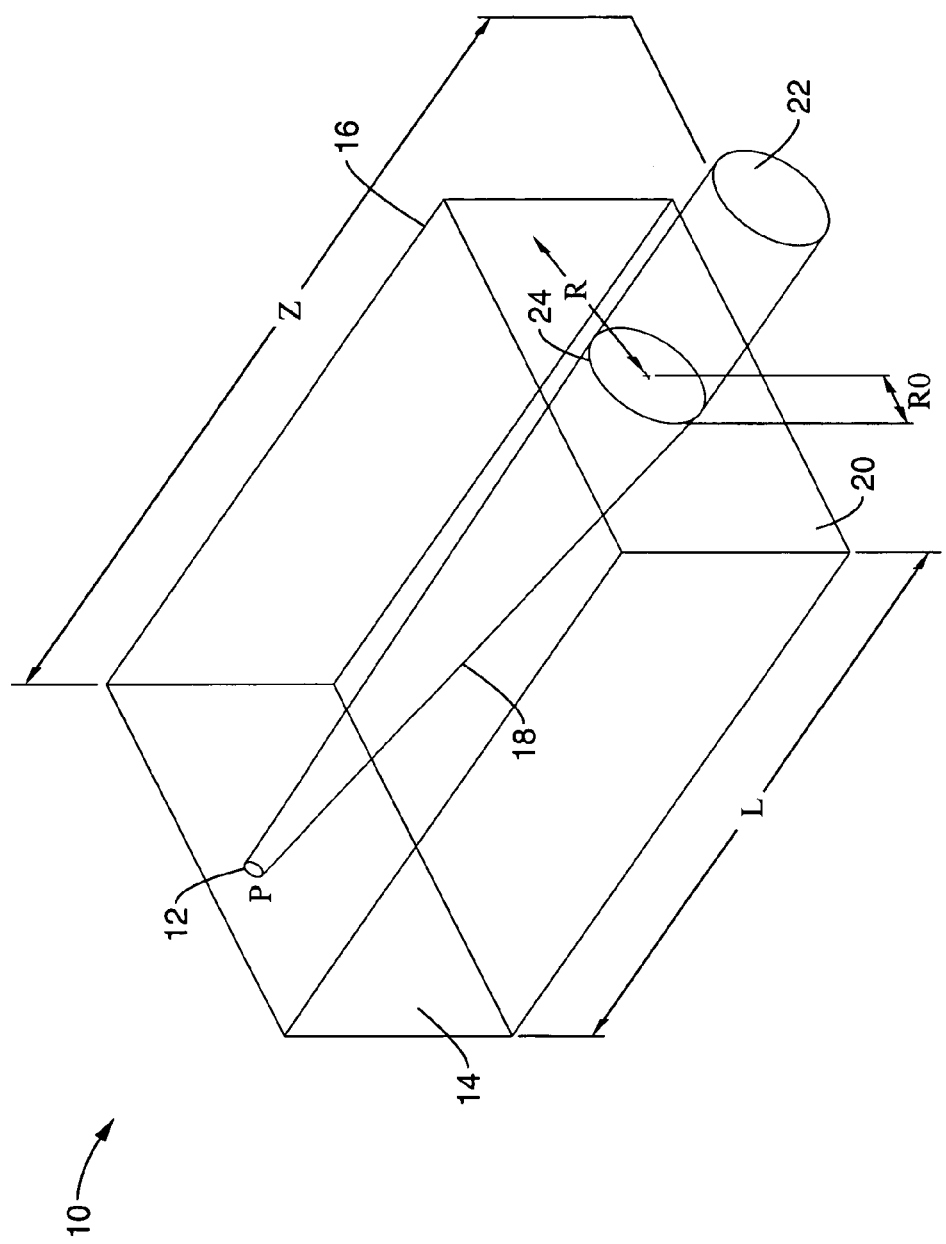
FIG. 1 is a schematic diagram of a biaxial crystal setup in accordance with the present invention.

FIG. 1 illustrates a schematic view of a basic setup of the system 10 of the present invention. An emitting point 12 is positioned at the entrance or input face 14 of biaxial crystal 16. A cone of light 18 emerges from the light point 12, with the light propagating along the optical axis, or optical path Z, of the biaxial crystal 16. The light emerges at the exit face 20 of crystal 16, and is observed at a plane 22 down the optical path via an instrument such as a detector, microscope objective, or the like.

Figure 2:
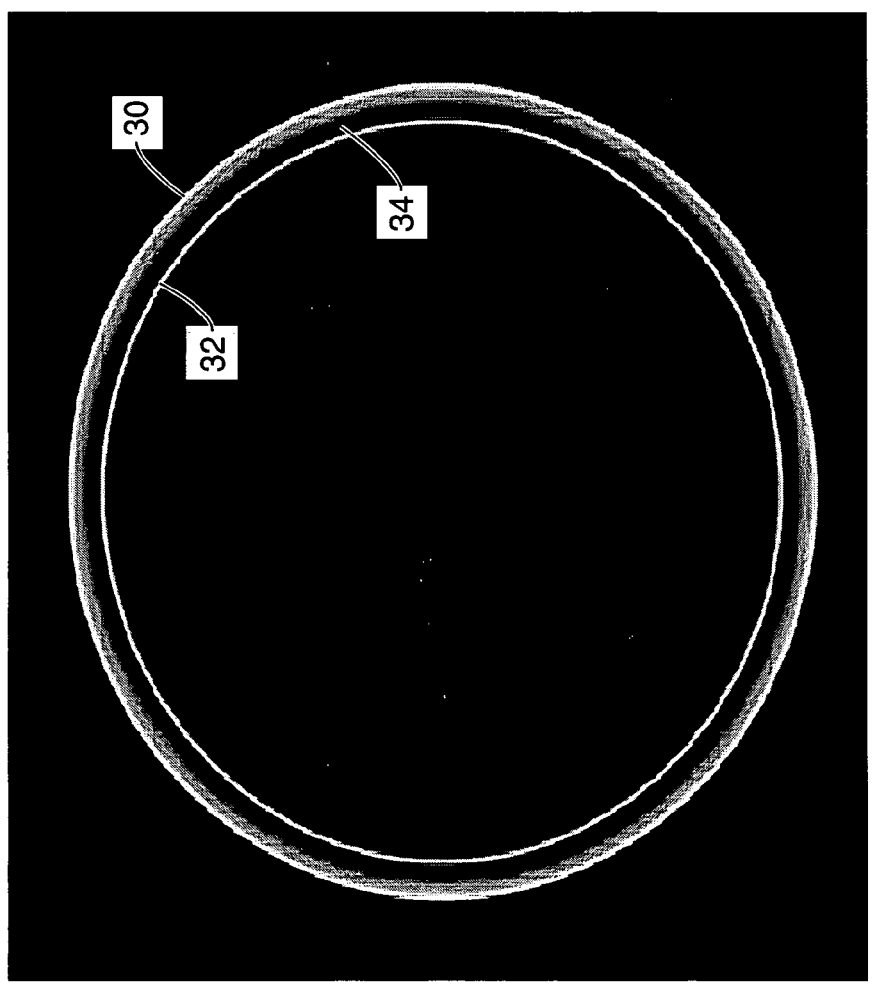
FIG. 2 is an exemplary image of Poggendorff rings after exiting a biaxial crystal.

As shown in FIG. 2, the light emerges at the exit face 20 as two concentric bright thin rings or circles, e.g. outer circle 30 and inner circle 32, with a dark circle 34 between them, also known as Poggendorff rings. Thus, a single point is transformed in a thin ring structure. The ring structure shown in FIG. 2 has peculiar properties due to the singular behavior of the light inside the crystal 16. The dark circle 34 is caused by an inherent sign-change in the amplitude as in a phase mask. This transformation is done with a minimal loss of energy.

The relative intensity and shape of the pattern depends on the emission light angular light distribution and on the position of the observation plane 22. Different light shaping strategies may be used in order to create circles with predetermined light distribution at the observation plane 22.

Figure 3:
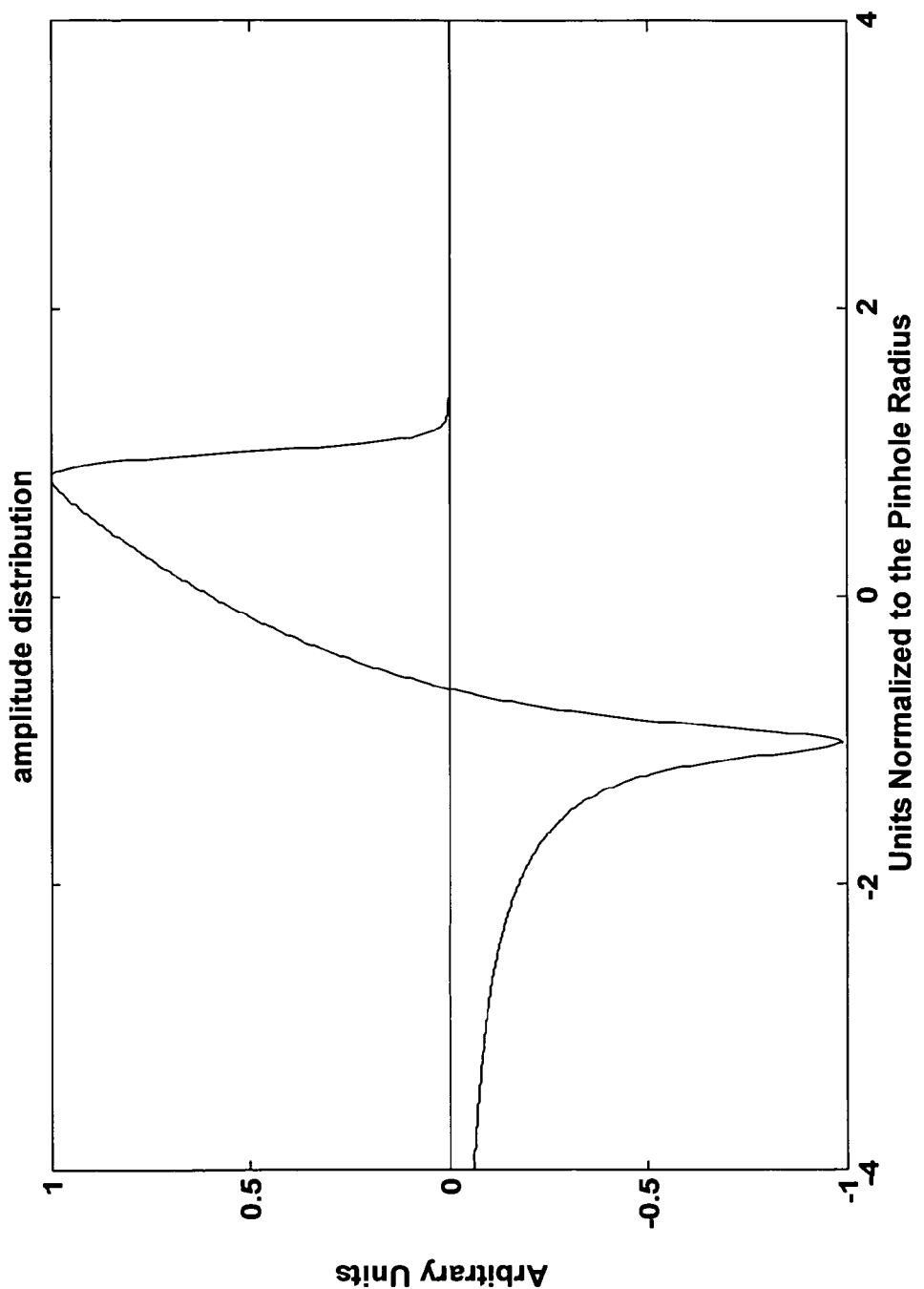
FIG. 3 illustrates a graph of the simulation of the amplitude of Poggendorff rings for a focused pinhole, imaged by a microscope objective.
Figure 4:
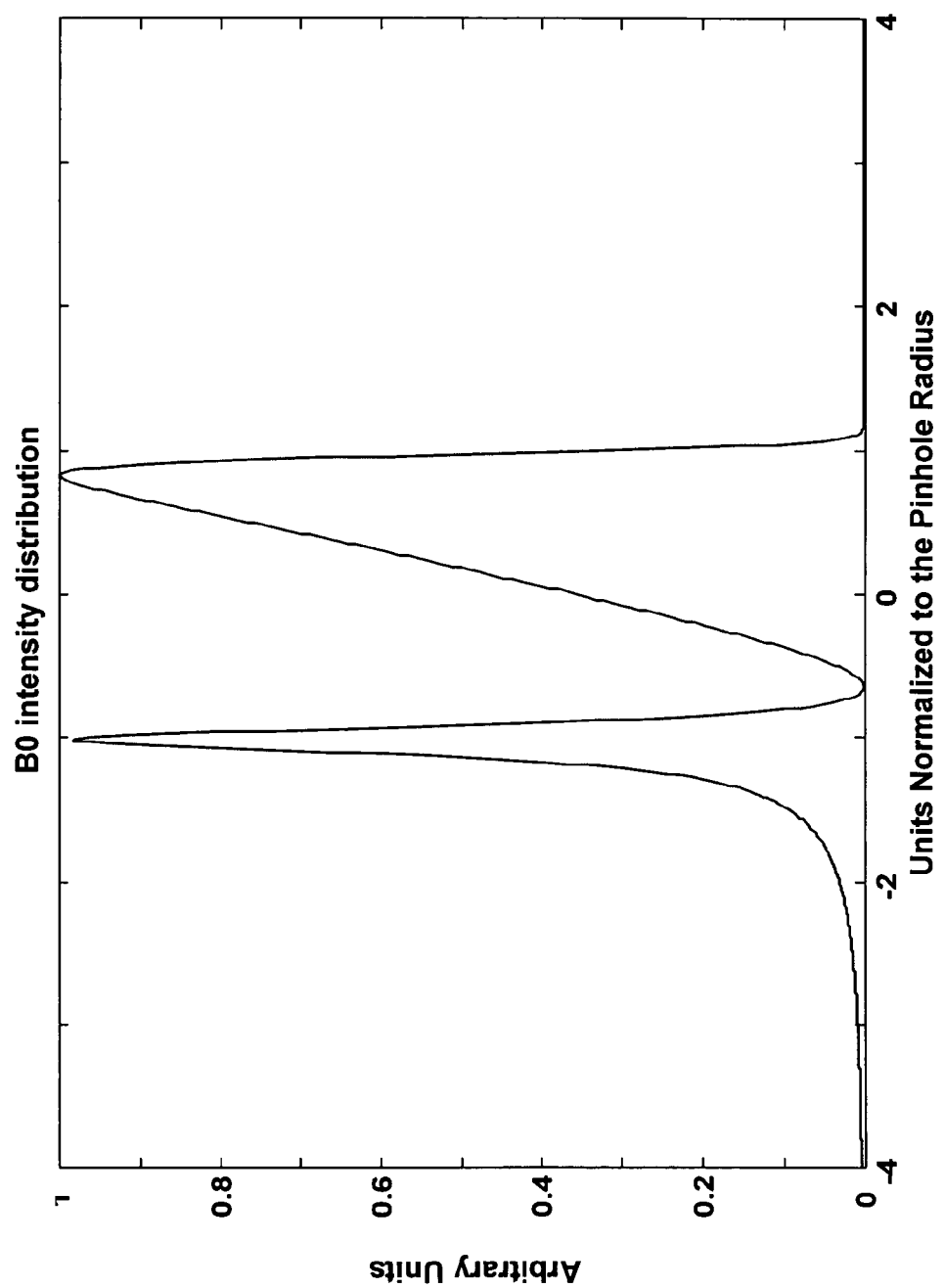
FIG. 4 illustrates a graph of the simulation of the intensity of Poggendorff rings for a focused pinhole, imaged by a microscope objective.

FIGS. 3 and 4 illustrate the simulated behavior of Poggendorff rings amplitude and intensity distribution, with parameters $R_o=1$ mm, $W=50$ μm, and $Z=0$ The simplest case is a focused pinhole imaged through a microscope objective. At the Poggendorff dark ring 34, (point B) the amplitude reverses its sign and at the corresponding point in FIG. 4 the intensity is a zero crossing. The position of the dark ring zero is a stable topological feature and is present in all Poggendorff rings.

The amplitude distribution of the rings will differ from the image intensity in any regular linear optical device. Measurement of the center of a ring removes a major source of error in the measurement of the position of a point; i.e., pixel quantization error. This error occurs in the common case that the point size is comparable to the pixel size. In a spot measurement, the photons will fall on a single pixel or a small number of pixels. The subpixel information is washed out and can be only partially recovered in special cases, necessitating a huge oversampling of the image. Even if such a solution is acceptable in large astronomical systems—as GAIA—it may be impracticable for industrial systems. In measuring the center of a ring, a dithering effect exists, and the discretization error is averaged out along the circumference of the ring.

In one embodiment of the invention, using coherent light, the following two mathematical actions are performed simultaneously on the light distribution:

1. Two-dimensional image information is high-pass filtered, removing the background and low frequency components; and
2. The light point (e.g. point 12 in FIG. 1) is transformed into a thin circle.

Both of these two steps are performed optically. For an ensemble of light points or small features, the first step will remove the fixed and slowly varying background, while the second step transforms the light input into a pattern well fitted for accurate position measurement.

The method allows for the lateral positioning of the points to be accurately recovered, because the center of a circle can be retrieved more accurately then the position of a point. The pattern is quite stable within a large defocusing range.

Figure 6:
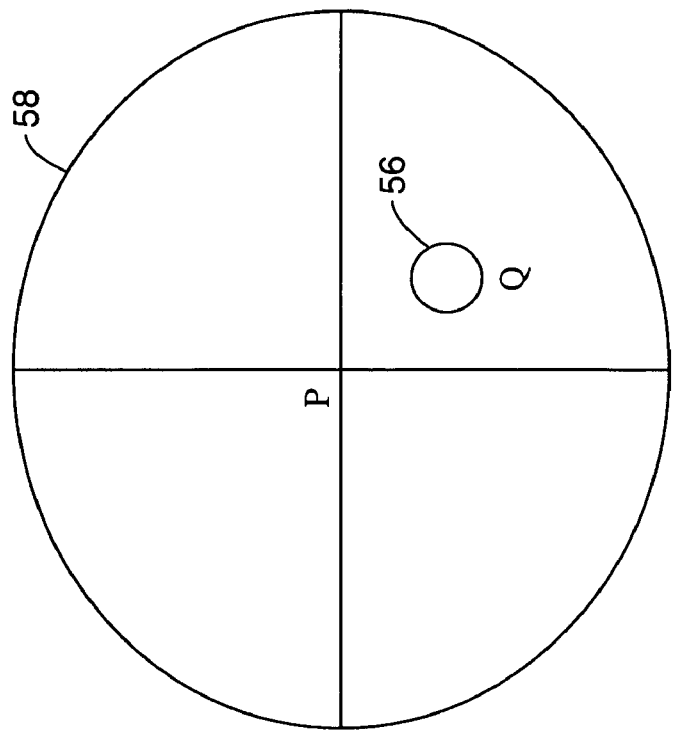
FIG. 6 illustrates an arrow and target test target.
Figure 5:
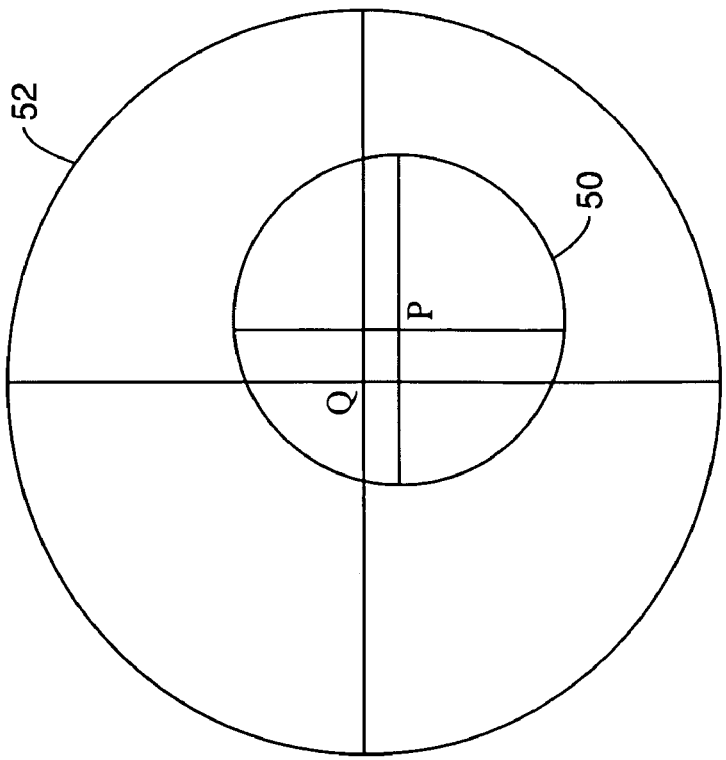
FIG. 5 illustrates a two concentric circle test structure.

FIG. 5 illustrates a concentric circles test pattern. A small circle, e.g. 50 or 52, also creates also an image pattern of Poggendorff rings. The rings, for a circle, are separated by a value close to the circle radius. FIG. 6 illustrates an "arrow and target" test pattern characterized by a point 56 and circle 58. P and Q denote center points of the circles (or point 56 for "arrow and target" test pattern). The case of two concentric rings, or a point and a circle, is of significant practical interest, e.g. for overlay pattern in semiconductor applications or other applications.

Figure 7:
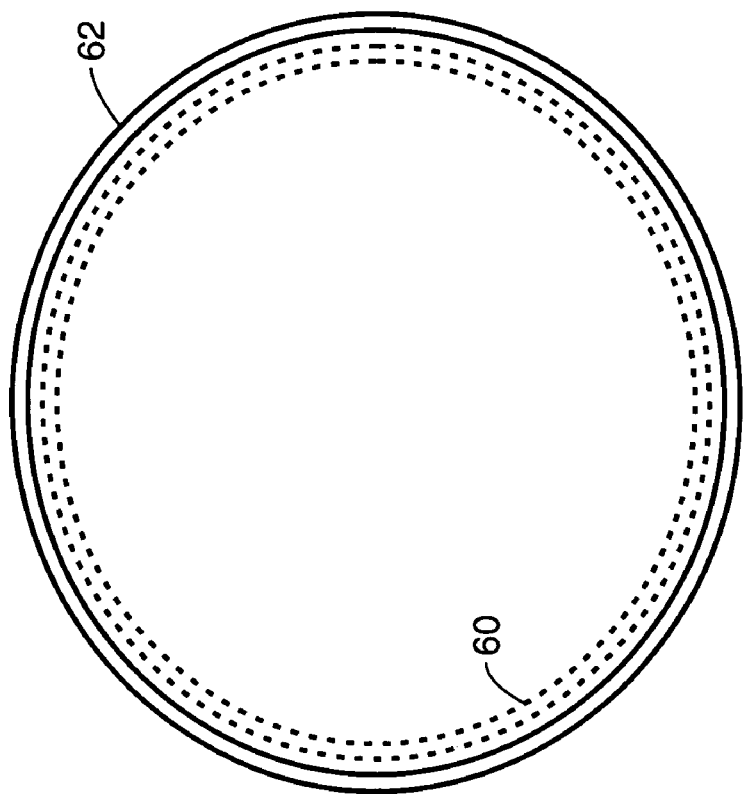
FIG. 7 illustrates the simulation of the superposition of Poggendorff rings of a point and a small circle.

The image for a point and a circle is represented in FIG. 7, which illustrates the superposition of Poggendorff rings of a point (the innermost ring 60) and a small circle (the outermost ring 62). This pattern provides a very sensitive measurement of the misfit between the two layers, and the geometry is well adapted to retrieve even small departures from concentricity.

For a small target, a circularly polarized incoming light in a biaxial crystal creates two separate waves, with inverse handiness. These waves are (1) a fundamental wave and (2) a vortex wave. The fundamental wave has the same handiness as the incoming polarization, while the vortex wave has a circular polarization with the opposite handiness to the incoming polarization. The vortex wave carries information on a spatially filtered version of the input.

The resulting light distribution is a convolution of a filtered version of the image with Poggendorff ring distribution; i.e., every point is converted to a finite-width ring as illustrated in FIG. 2. By removing the fundamental wave with an adequate circular polarizer, it is possible to remove the background from the image and to keep a coded version of the incoming filtered image. In this coded image, each point is transformed to a large circle.

For imaging microscopy, a numerical deconvolution is needed to retrieve the original image. The resulting image may indeed contain more details than in standard microscopy. For automated microscopy, when the object is a cloud of points, the image can be processed directly without needing full deconvolution. Note also that the rings became thicker as a function of longitudinal position but keep the basic symmetry. By a proper choice of the optical parameters, the useable depth of field may be larger then in an imaging configuration.

With regard to implementation of the invention, several industrial and natural biaxial crystals are available. The developments in the field of non-linear, optical parametric oscillators, frequency doubling and molecular optics have yielded a large number of new industrial biaxial crystals. These crystals are available in large sizes in different transmission ranges, suitable for the proposed applications. Exemplary crystals include, KTP, POM, BIBO, LAP, LBO, $KNbO_3$, DAST, MBANP, AANP, YCOB and MDT. Table 1 summarizes the properties of some of the organic and inorganic biaxial crystals. A more detailed description of these crystals and their properties may be found in Hansson, G., et al., *Transmission measurements in KTP and isomorphic compounds*. Applied Optics, 2000. 39(27): p. 5058-5069, Zhang, W. Q., *Femtosecond second and third harmonic light generation in biaxial crystal KTP*. Optik, 1997. 104(3): p. 87-91, Hellstrom, J., et al., *Optical parametric amplification in periodically poled KTiOPO4 seeded by an Er-Yb: glass microchip laser*. Optics Letters, 2001. 26(6): p. 352-354, Hierle, R., J. Badan, and J. Zyss, Growth and Characterization of a New Material for Nonlinear Optics—Methyl-3-Nitro-4-Pyridine-1-Oxide (Pom). Journal of Crystal Growth, 1984. 69(2-3): p. 545-554, Eimerl, D., et al., *Deuterated L-Arginine Phosphate—A New Efficient Nonlinear Crystal*. IEEE Journal Of Quantum Electronics, 1989. 25(2): p. 179-193, Meier, U., et al., *DAST a high optical nonlinearity organic crystal. Synthetic Metals,* 2000. 109(1-3): p. 19-22, Rai, R. N., et al., *Crystal morphology, solubility, optical and nonlinear optical studies of DAST crystals grown from different solvents*. Journal Of The Chinese Institute Of Chemical Engineers, 2002. 33(5): p. 461-468, Kaminskii, A. A., et al., *Monocrystalline 2-adamantylamino-5-nitropyridine (AANP)—a novel organic material for laser Raman converters in the visible and near-IR*. Japanese Journal of Applied Physics Part 2-Letters, 2002. 41(6A): p. L603-L605, Taima, T., K. Komatsu, and T. Kaino, *Novel crystallization method: Ring-heater heated pedestal growth method for nonlinear optical organic material*. Journal of Nonlinear Optical Physics & Materials, 2002. 11(1): p. 49-55, Tomaru, S., et al., *Nonlinear Optical-Properties of 2-Adamantylamino-5-Nitropyridine Crystals*. Applied Physics Letters, 1991. 58(23): p. 2583-2585, Li, L. X., et al., *Growth and spectra of YCOB and Nd: YCOB crystals*. Crystal Research and Technology, 2000. 35(11-12): p. 1361-1371, and Vivien, D., et al., *Crystal growth and optical properties of rare earth calcium oxoborates*. Journal Of Crystal Growth, 2002. 237: p. 621-628, each of which is incorporated herein by reference in its entirety.

Several crystals have absorption range in the UV going down to 220-250 nm. LBO is the only crystal with transmission at 193 nm; LBO transmission threshold is 155 nm and so, LBO crystals may be used even at 157 nm. The DAST crystal is the most potent biaxial crystal, is currently the only biaxial crystal reaching an angle of more than 8.5 degrees, and is currently produced industrially in small sizes. POM, KNbO$_3$ MDT crystals are also produced industrially, and can reach a size of 5 mm×5 mm×20 mm thus making them suitable for microscopy applications.

Figure 8:
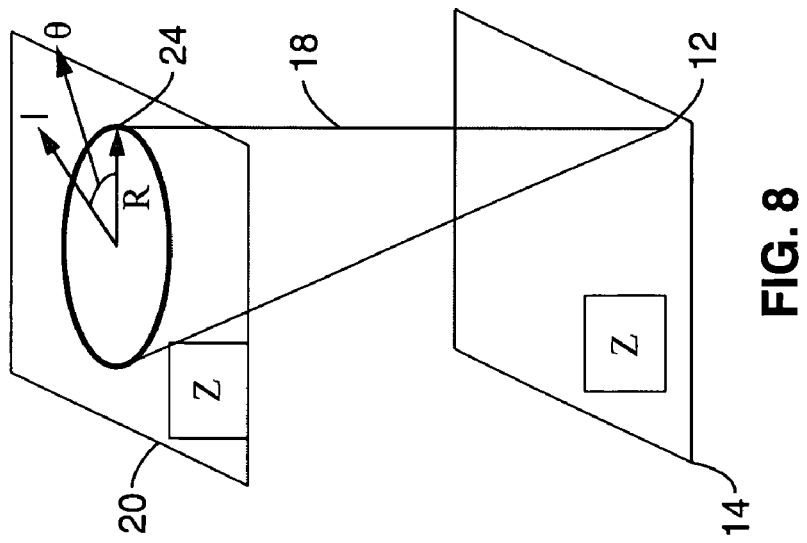
FIG. 8 illustrates a cone defined coordinate system for a biaxial crystal.

FIG. 8 schematically illustrates light propagation theory in biaxial crystals. For a circularly polarized incoming light, for a centrosymmetric object, an incoming light distribution is defined, $D_0(R,0)$, at the plane z=0 (i.e. input face 14), in terms of a displacement electrical vector D. The coordinates used are transverse cone-centered coordinates $\{x, y, z\}=\{R, z\}$.

The displacement electrical vector equation simplifies to:

$$D(R,z)=B_0(R,R_0,Z)d_R - i \exp(i\theta_p)B_1(R,R_0,Z)d_L, \quad (1)$$

where $B_0(R,R_0,Z)$ and $B_1(R,R_0,Z)$ are the fundamental and vortex waves, and:

1. The circular right and left polarization eigenmodes are denoted by $d_R$ and $d_L$.
2. Z is an equivalent optical path, corrected by the index of refraction.
3. R is the magnitude of the spatial vector R.
4. $R_0$ is the radius of the cylinder of refraction 24 beyond the crystal 5. $\theta_R$ is an azimuthal angle of the R vector in the transverse cone-centered coordinates (FIG. 5).

Note that the two waves $B_0(R,R_0,Z)$ and $B_1(R,R_0,Z)$, have different properties. The fundamental wave, $B_0(R,R_0,Z)$, has the same polarization as the incoming light distribution; its transfer function at P=0, for a constant light distribution and for low frequency components ($P<<1/R_0$) is unity. On the other hand, the vortex wave, $B_1(R,R_0,Z)$, has a polarization orthogonal to the incoming light distribution. Its transfer function at P=0 is zero. An additional azimuthally dependent phase shift is superposed on the vortex wave. The vortex wave creates a high pass filtered version of the input light distribution, with a limiting spatial frequency equal to $1/R_0$.

Using a suitable circular polarizer it is possible to choose either the fundamental or the vortex wave accordingly.

Consider an incoming field distribution composed of background and signal terms:

$$D_0(R,0)=C\,D_C(R,0)+q\,d_0(R,0), \quad (2)$$

where $D_C(R,0)$ represents a constant background, either in the form of a step function or an apodized function, and where $d_0(R,0)$ represents a small optical feature modelized either as a Fermi-Dirac or Gaussian spot. The parameter q characterizes the signal to background ratio. For a faint amplitude object q is small, real and positive, for a faint absorption object q is negative and for a faint phase object q is small and imaginary.

Figure 10:
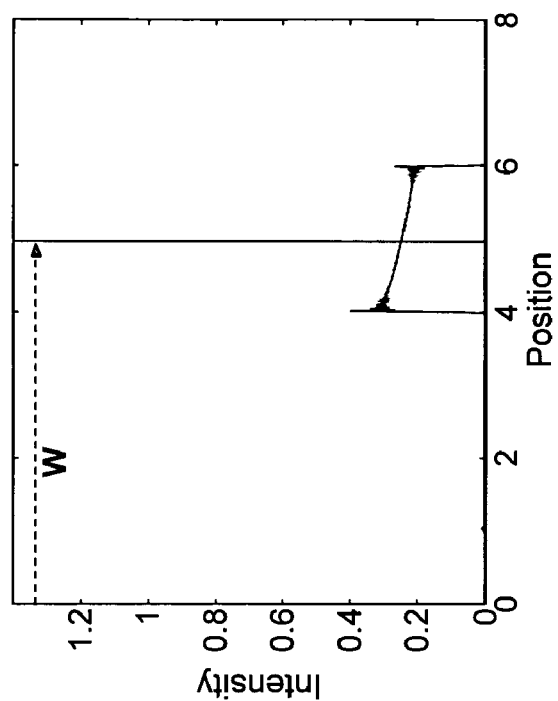
FIG. 10 is a graph illustrating the simulation of a vortex wave for a step function background.
Figure 9:
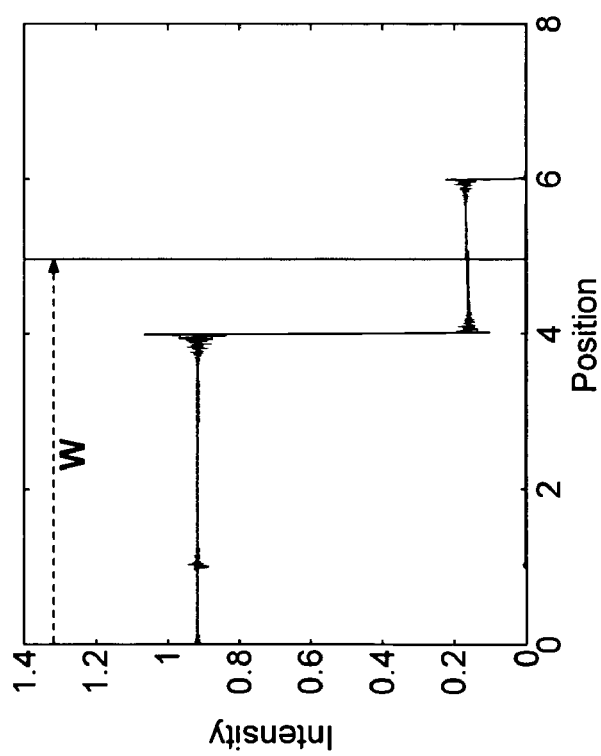
FIG. 9 is a graph illustrating the simulation of the a fundamental wave for a step function background.
Figure 12:
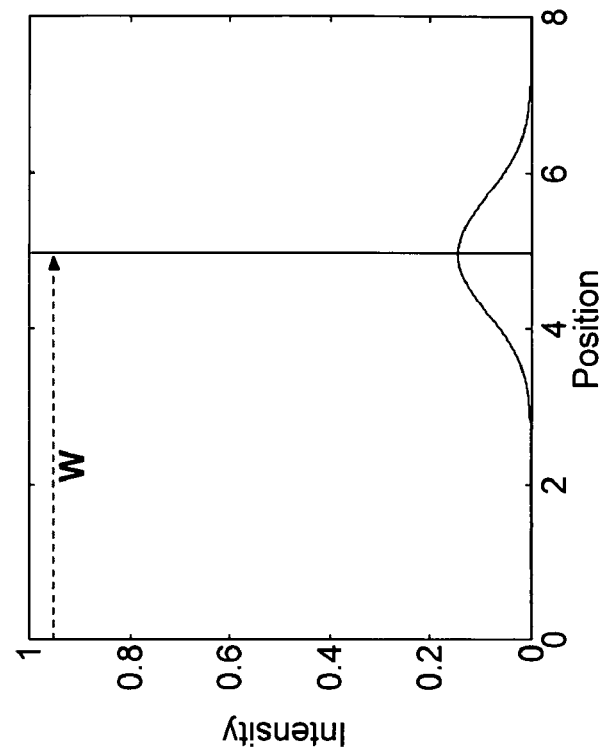
FIG. 12 is a graph illustrating simulation of a vortex wave for an apodized background.
Figure 11:
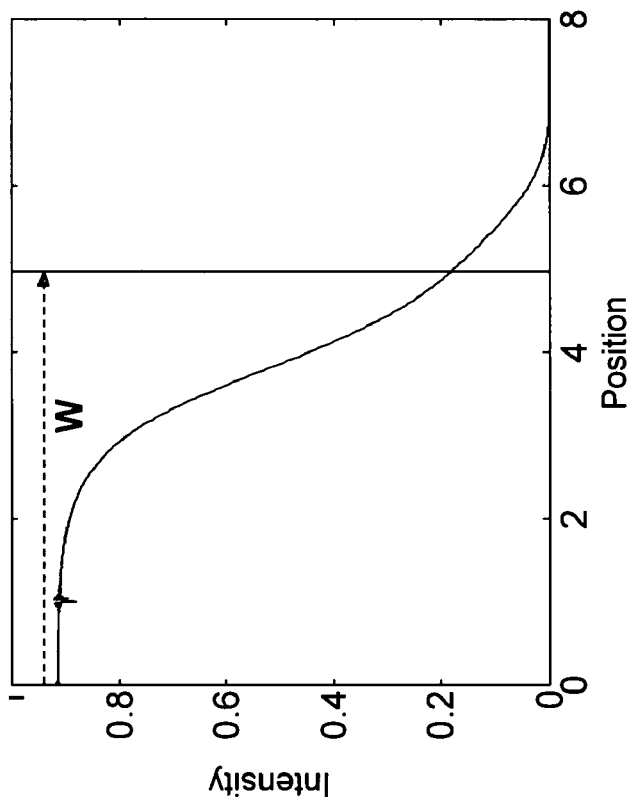
FIG. 11 is a graph illustrating the simulation of a fundamental wave for an apodized background.

We simulated numerically the background and signal terms separately for the fundamental and vortex waves using the equations described by Berry [1]. Because the spatial background frequency is below $1/R_0$, the energy of the background is concentrated in the fundamental wave, with some energy present in the vortex wave at the edges of the background in the region between (W−R$_0$) and (W+R$_0$). FIG. 9 illustrates the fundamental wave for a step function background of extent W, represented by an arrow, without apodization (i.e. a lens treatment configured to cut down diffraction fringes that appear around bright points of light). FIG. 10 shows the vortex wave for a step function background of extent W, represented by an arrow. The vortex wave is noticeable only at the edge of the background, in a region between W−R0 and W+R0. The energy leaking to the vortex wave may be reduced and smoothed by apodization (as shown in FIGS. 11 and 12) or can be removed by an appropriate mask, of size below W−R$_0$, in the image plane. FIG. 11 shows a fundamental wave for an apodized background of extent W, and FIG. 12 illustrates the vortex wave for an apodized background of extent W. The vortex wave is smaller but extends more than in the non-apodized case.

Figure 13:
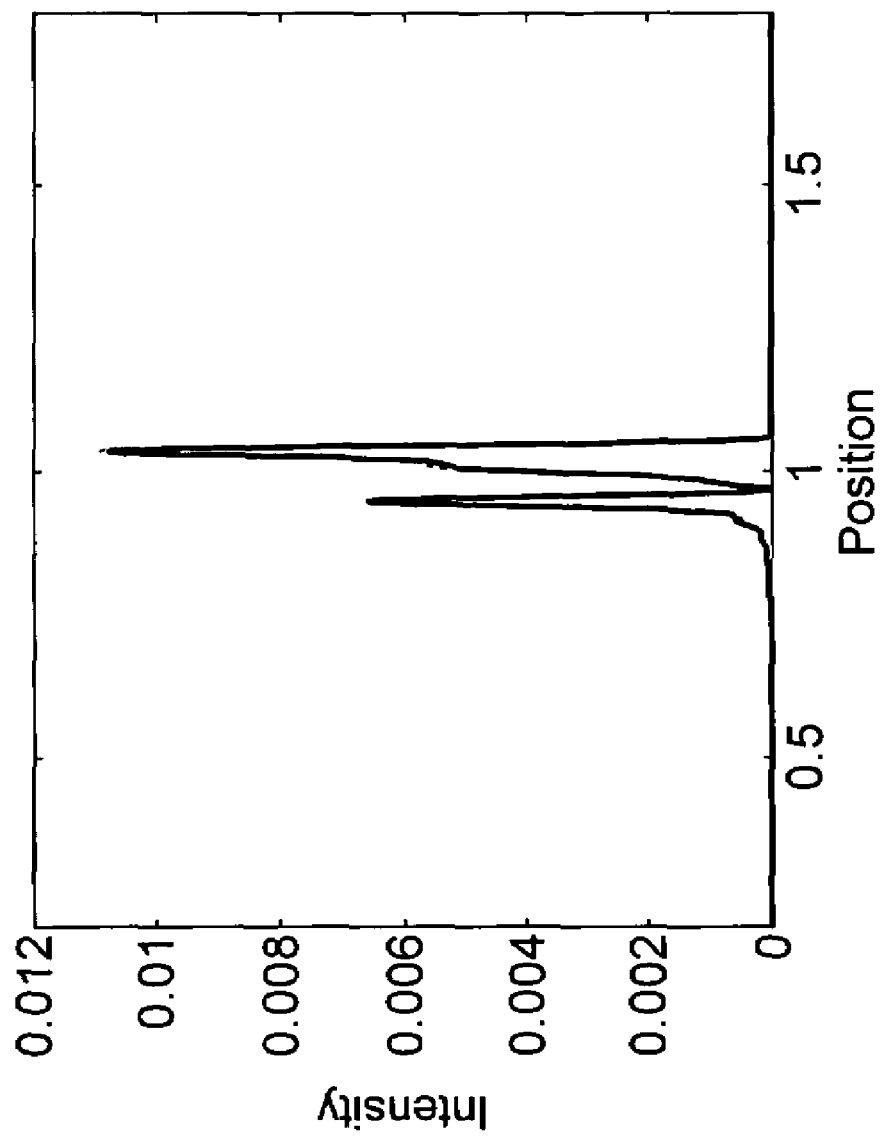
FIG. 13 is a graph illustrating simulations of the fundamental and vortex waves for a small coherently illuminated spot.

As illustrated in FIG. 13, the signal frequency is much larger than $1/R_0$ and is split evenly between the fundamental and vortex waves. This figure presents the fundamental and vortex waves intensity, as a function of R, for a small coherently illuminated spot. The two waves are almost identical. Note that the waves are hollow cylinders with radius $R_0$ around the spot position.

Figure 14:
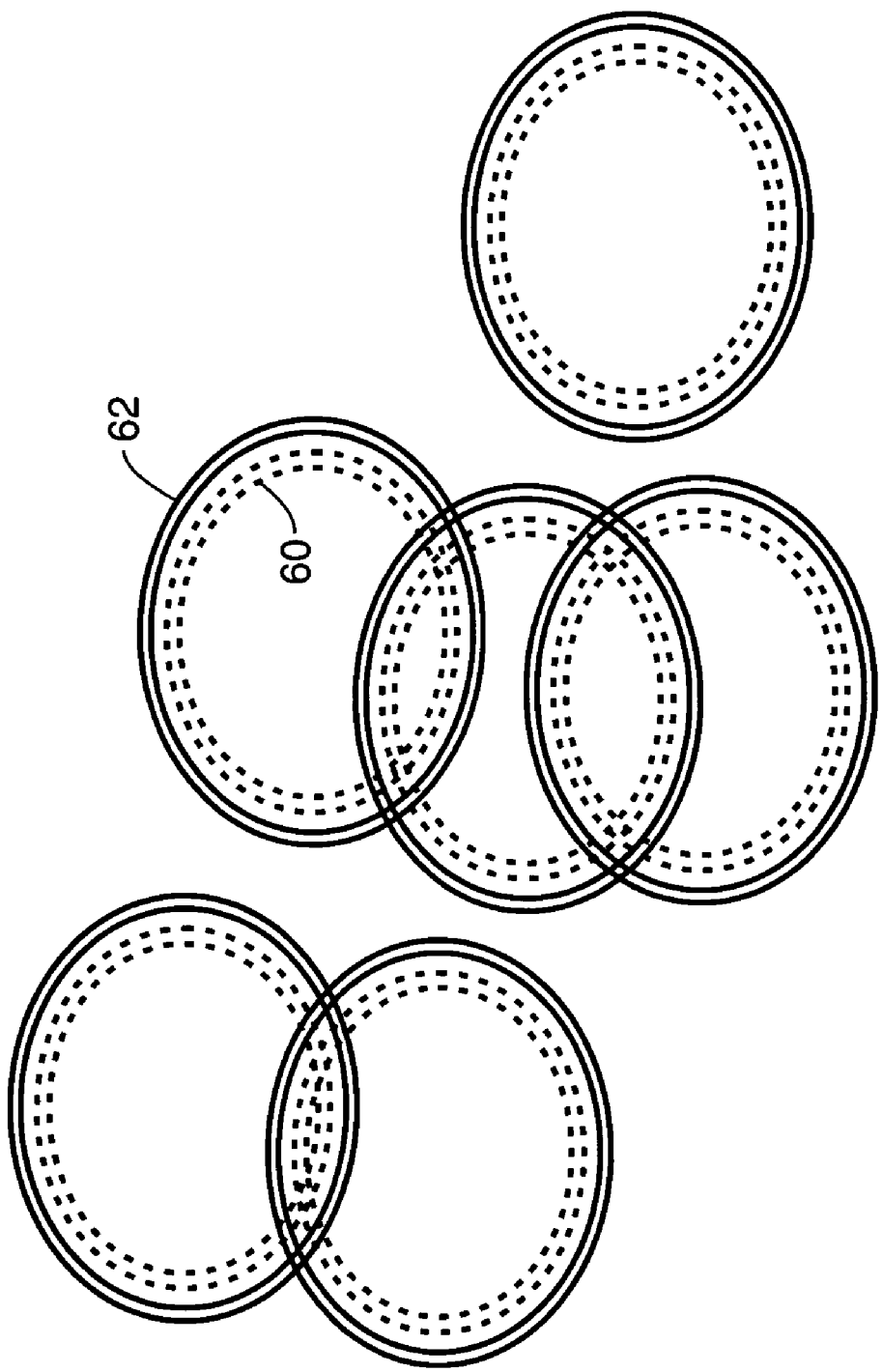
FIG. 14 is a simulated image of the intensity distribution at the output plan of the vortex wave for an object consisting of six randomly positioned spots.

FIG. 14 is a simulated image of the intensity distribution at the output plane of the vortex wave for an object consisting of six randomly positioned spots having random intensities. Note that the spots create hollow rings 70 centered at the spot's projected lateral position, with the radius of the dark ring close to $R_0$.

The light is right circularly polarized. By adding a left-handed circular polarizer, the system efficiently removes the background and filter all spatial frequency terms smaller then $1/R_0$. Specifically, the fundamental wave is removed, the background C is subtracted and only the vortex wave, $B_1(R, R_0, Z)$, will pass through.

From the foregoing discussion it can be seen that the invention has several advantages relative to the previous methods. These advantages include:

1. Background suppression: In coherent light, only a few of the existing methods provide optical background suppression. However, these methods are more cumbersome and the set-up is more complex and less robust than with the present invention. It should be noted that the background suppression will happen only for coherent and partially coherent light unlike the other features of this invention which apply also to incoherent light.

2. Geometrical pattern: The transformation of a point to a thin circle permits a precise measurement of the point's position.

3. Field depth: The field depth of the measurement is larger than the lens field depth.

4. Discretization noise: The circle pattern removes a major source of noise, due to CCD discretization.

5. Diffraction limit: The pattern created is thinner then the diffraction limit in linear regular optical systems.

6. Relative positioning of two features: The method opens new possibilities to compare accurately two features such as a point and a circle or two concentric circles.

It is contemplated that the present invention can be applied for single molecule detection and positioning, and/or for nanobiotechnology.

For example, imaging and position sensing is a major building block required in most nanobiotechnology applications. The parameters to be measured are the presence of the molecule and its position as function of time. From these values it is possible to retrieve the dynamics of a chemical or biological process, in order to characterize and control it interactively.

The present method may permit an increase in the precision of the measurement of spatial parameters. This increase can be translated, in diagnostic applications, to an improvement of the diagnostic effectiveness and reliability. In control applications the performance improvement may yield a better control of the process.

Another example is use of the invention with automated microscopy systems that are primarily used in pharmaceutics, medical diagnostics, and automated packaging of chips and semiconductor wafers. An increase of spatial measurement precision will be translated to an additional reliability of the process results.

Furthermore, many quantitative applications in microscopy can be reduced to the identification, count, position and velocity of single light points. The range of applications that can be addressed by the present invention includes fluorescent markers, particles and powders.

Another type of application where the present invention can be implemented includes recognition, identification, and positioning of small specific features. The ability to filter optically the background and to create a high pass filter to emphasize small features permits a better recognition and may improve the performance of these applications.

Still another application for the present invention is wafer alignment and for semiconductor pattern overlay.

Wafer positioning is the ability to measure the position of a fiducial mark on the wafer, either dynamically to control the wafer movement or statically to assert the wafer position. The advance of lithography towards nanoscales creates a challenge to alignment of wafers in real-time with adequate accuracy. Semiconductor processing equipment is very expensive. The prerequisite is to be able to process as many wafers as possible in a short time. A meaningful part of the processing time is related to the loading and unloading of wafers. The positioning of a new unprocessed wafer at the right position has clear implications for the overall yield of the full system.

A dynamic measurement of the wafer position for determining whether the wafer is close to the final position may permit an optimization of the final approach of the wafer. The assessment of the final position of the wafer relative to the system and the mask is also important in optimizing the process.

Semiconductor pattern overlay is a still further application for the Invention. Semiconductor pattern overlay is the measurement of vector displacement from one process level (substrate) to another level (resist), usually separated by an intermediate (thin-film) layer. The standard silicon wafer technology process is:

1. Imaging a mask on a photopolymer.
2. Developing the photopolymer;
3. Etching or doping the silicon through the photopolymer pattern in order to transfer a negative replica of the pattern in the silicon.

A major performance index is the ability to accurately position the photopolymer pattern relative to previous patterns already etched or doped in the silicon. This parameter is known as overlay requirement. Overlay measurement involves the determination of the centerline of each structure along both the X and Y axes. Centerline determination uses the symmetry around the structure's center such that the error associated with edge determination will tend to cancel from each side of the structure.

Overlay error, i.e., the planar distance from the center of the substrate target to the center of the resist-defined target, is commonly measured using a variant of the box-in-box test structure.

For the method of the present invention, either the two concentric circles (FIG. 5) or an "arrow and target" test structure (FIG. 6) may be used as the basic overlay pattern. For two concentric circles, a first circle 50 is positioned on the wafer and a second circle 52 is positioned on the resist. For the arrow and target, a spot 56 is positioned on the wafer and a circle 58 on the resist. The overlay error is the distance between P and Q, which are the centers of the two circles or the spot and circle centers.

FIGS. 15A-C illustrate the image corresponding to an "arrow in a target", i.e. a point at the center of a small circle is represented, where the point pattern is represented by the inner ring 60 and the circle pattern is represented by the outer ring 62. Superposition of Poggendorff rings reveals that the two features are concentric in FIG. 15A, have an x-axis misfit in FIG. 15B and y-axis misfit in FIG. 15C.

The Poggendorff metrology method of the present invention uses the measure of the dark Poggendorff ring position for metrology. By recording the position of the black Poggendorff ring, the position of a point or an optical feature may be retrieved with high accuracy. The position accuracy of the dark ring is not limited by diffraction but only by photon statistics.

In the present method, fiducial marks created on the wafer comprise of points or small circles with different diameters on each one of the layers. The marks are then observed through a high magnification microscope and the resulting image is passed through the crystal set-up. The resulting pattern, for each circle, is made of two concentric Poggendorff rings pattern with different diameters. The Poggendorff rings will create, when accurately aligned, a Bull's eye target (as shown in FIGS. 5 and 6). Such a target is very sensitive to overlay misalignment and can provide very high accuracy positioning.

All overlay solutions are based today on relatively complex targets. Indeed, a complex and rich motif is necessary to reach the required precision. In the method of the present invention, the target collapses to a single point or to a small circle. The complex motif necessary for the positioning accuracy is created afterwards by the conical diffraction. Because the target surface on the wafer is quite small, a sizeable error source, the tool induced error is reduced. The Poggendorff rings, as phase masks, are relatively insensitive to focus, removing a major uncertainty parameter in the overlay metrology system.

Additionally, since the pattern is created by the biaxial crystal and not as a physical pattern etched on the wafer, there will be a marked reduction in one of the major error source, the OFS—Overlay Mark Fidelity. Moreover, more targets can be added, in any unused surface on the mask, even in the active part of the chip, with minimal penalty. Adding more targets reduces the unmodeled residuals error, the main error in overlay metrology.

Note that emerging technologies such as nano-imprints are even more dependent on the accuracy of the relative positioning of the wafer and mask. The error of positioning is today a major limit for the applications of this technology. The simplest and most commonly applied solution is to measure the position of several fiducial marks positioned at strategic points on the wafer or mask, using imaging techniques. This imaging approach is limited in precision due to diffraction and creates strong constraints on the system design due to its limited field depth.

The Poggendorff ring pattern can be used as the basis of a lithographic technique, e.g. Poggendorff lithography, either by direct projection or through additional projection optics.

If the Poggendorff rings pattern is directly projected or reimaged with appropriate reduction on a negative photoresist, a ring can be created by standard lithographic techniques. The thickness will be limited only by process threshold value and not by diffraction effects. Like phase mask lithography (see Levenson, M.D., et al., *The Phase-Shifting Mask.2. Imaging Simulations And Submicrometer Resist Exposures*. Ieee Transactions On Electron Devices, 1984. 31(6): p. 753-763, Levenson, M.D., N. S. Viswanathan, and R. A. Simpson, *Improving Resolution In Photolithography With A Phase-Shifting Mask*. Ieee Transactions On Electron Devices, 1982. 29(12): p. 1828-1836.], incorporated herein by reference in their entirety), an amplitude zero crossing is created artificially by the juxtaposition of two regions of opposite phases on the mask. Very thin features (as thin as 9 nm), much below the diffraction limit, have been obtained using phase marks.

However, a major difference between the present invention and other existing lithographic technologies is related to the fact that the circle is not—or not only—at the emitting point position. Several points, on the same mask, may be illuminated; a more complex pattern corresponding to coherent or incoherent superposition of these patterns can be realized in a single exposure.

The method of the present invention has various additional features uncommon in lithographic techniques.

As stated, the method of the method of the present invention may be configured to create a superposition of several circles using a single exposure. An array of contact holes, with potential dimensions in the low tens of nm, may be realized as the intersection of two rings for each hole, within a single exposure.

In addition, the dark ring position may be more independent of focusing then existing technologies, yielding a large process window. Unlike phase masks, the ring is a topological sound closed structure and does not create phase conflicts.

Furthermore, the circles created by the method of the present invention are geometrically perfect, depending only on the polarization quality which can be accurately controlled and limited only by the photoresist quality. The method can theoretically be performed even with low NA optics.

Although the present description is primarily directed to the behavior of the light coming from a single point, it is appreciated that his behavior can be generalized to multipoint features. It is also important to stress that the point light distribution maybe a pinhole or a Gaussian beam, as described in Berry, M. V., *Conical diffraction asymptotics: fine structure of Poggendorff rings and axial spike*. Journal Of Optics A-Pure And Applied Optics, 2004. 6(4): p. 289-300, previously incorporated by reference, but many additional points may be used, including but not limited to, annular, both opaque and phase, apodized holes or any adequate circular light distribution.

It should be noted that the system has to adjust to the small angle limitation of biaxial crystals. The conical diffraction occurs only for light with an angular spread of the order of the half-angle of the diffraction cone. This may necessitate in some set-ups the use of an intermediate optical system which will reduce the light pattern created by the conical diffraction system and adapt it to the dimensions of the lithographic pattern Ring structures have been proposed as building blocks of nanophotonics. Sub-100 nm, circle and ring structures are also ideal for realizing Zone Plates for X-ray Imaging and Lithography. Finally, sub wavelength structures are beginning to find applications as polarizer, retarder and Moth eye (antireflective) coatings.

Contact holes are one of the top challenges currently found in lithography. Using a ring or circle pattern, contact holes can be made by the intersection of two, or more, circles. Phase shift lithography solutions need multiple exposures for realizing contact holes. Indeed, phase mask lithography is based on a "point to point" structure, and when two features have to be superimposed, two exposures are needed.

In one embodiment of the present invention, contact holes are realized using two illuminating points, at 90 degrees one from the other, using 4 points on a cross pattern or any adequate geometrical points pattern.

In yet another embodiment, illustrated as system 100 in FIG. 16, a first biaxial crystal 102 creates a ring 106, using conical refraction 104 through the first crystal.

A mask 108 is applied, along the dark ring (e.g. ring 34 in FIG. 2), removing the external Poggendorff ring (e.g. ring 30 in FIG. 2). This is due to the fact that the two rings have inverse amplitude and that the inner ring is thinner.

The inner ring is then directed to the input face 110 of a second biaxial crystal 112. It has to be reminded that a biaxial crystal has two axes, positioned symmetrically relative to the z optical axis, second biaxial crystal 112 may have its optical axis being the opposite axis of the one of the first crystal 102. The reason for the inversion is due to the fact that the Poggendorff circles are positioned with the original point being at the apex of the circle. Reversing the axis permits to compensate to this feature and to superpose the dark rings of all points at the initial location of the point. The resulting light distribution is vortex-like, with a very small dark point at the center of a light distribution.

The application of this set-up may also be used in maskless lithography, where the system creates a lithographic pattern point by point. This technique is developed in order to fulfill manufacturing needs of chips with smaller production quantities—as ASIC for example.

A schematic diagram of the Poggendorff lithography system 130 is shown in FIG. 17. A laser 132 (e.g. an ArF or KrF laser emitting a beam 193 nm in the UV), is focused on a point 136 with use of lens 134, or similar optics available in the art. The point 136 is at the input plane 140 of a biaxial crystal 142, (which may comprise, for example of, LBO). An additional imaging lens 144 is used to reimage the exit pattern in the Kohler plane 146 of a lithographic system. Focusing mechanism 144 is provided in order to control the size and shape of the pattern. Additional optical elements, such as imaging and holographic optical elements (HOE) or components 148, may be necessary to adjust the parameters of the output light distribution after the crystal 142 to the optical parameters necessitated by lithographic systems.

The light distribution in the Kohler plane 146 will have the structure of the above described Poggendorff rings. An additional stop (such as mask 108 in FIG. 16) may be used to remove the outer ring (or the inner ring) to keep only a single ring as the illumination pattern.

The above described system has the following distinctions advantages over existing OAI techniques:

Coherence state: The light is fully coherent around the circle even for incoherent or partially coherent light input. This peculiar situation is due to the degeneracy of the optical properties around the conical ring. The points around the ring are indistinguishable for their optical properties one from the other—except for their polarization state.

Several systems which cannot be implemented using linear optics can be implemented using optical propagation in biaxial crystals due to the singular behavior of the light propagation. A striking characteristic is the degeneracy of optical properties along the ring, in the sense that the points are derived coherently from the same initial point. Because of this, each point on the ring, and each angle ($\alpha x$, $\alpha y$) will have a conjugate point ($-\alpha x$, $-\alpha y$) with a phase difference of either 0° for the fundamental wave and 180° for the vortex wave fully coherent with it. The illumination may still be partially coherent, but with coherence circles located around the rings.

The Poggendorff Illumination of the present invention provides a symmetric coherent point for each off-axis illumination point. The system creates two orders—positive and negative—which interfere at the image plane. The positive order is the projection of the negative order created by the mask by the positive off-axis angle. The negative order is the projection of the positive order created by the mask by the negative off-axis angle.

Polarization: The polarization of the light in the present invention is rotating azimuthally. In an annular aperture the polarization of the light is fixed in a single direction.

The system provides an output with an azimuthally varying polarization. The polarization is rotating in a way that two opposite points will have orthogonal polarizations. Due to the requirements of lithographic illumination, an additional optical element, able to adjust the polarization to any predetermined polarization pattern will be necessary. Such devices have been described previously in the literature in the visible range and can be adapted to the UV.

Energy: All the energy is transferred from the point to the two rings. Although one of the rings is removed, most of the initial energy is recovered. The Poggendorff rings are an efficient way to transfer energy from a point to a ring without much energy loss.

Homogeneity: The Poggendorff rings of the present invention are homogeneous due to the filtering properties of biaxial crystals. Indeed, the light is spread homogeneously, around the circle, by the basic effect of conical diffraction, removing fully in this direction any local variation.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

| Crystal | A factor (degrees) | Available sizes (mm) | Notes |
| --- | --- | --- | --- |
| DAST | 8.71 | A few mm³ | |
| POM | 2.74 | (10)³ | |
| MBANP | | Very large crystals | |
| Naphthalene | 6.87 | (10)³ | |
| KTP | 0.98 | (10)³ | |
| MDT(KGW, KYW) | 2.5 | 5 × 3 × 24 | length up to 50 mm |
| KNbO₃ | 2.09 | (10)³ | |

What is claimed is:

1. A method for measuring the position of an optical feature, comprising:
    directing light associated with the optical feature along an axis of a biaxial crystal;
    conically refracting said light to transform the image of said optical feature to comprise a circular ring structure; and
    calculating the position of the optical feature by locating a center point associated with the circular ring structure.

2. A method as recited in claim 1, wherein the transformed image comprises Poggendorff rings.

3. A method as recited in claim 1, wherein the transformed image comprises an inner ring and an outer ring;
    wherein the inner ring and outer ring are concentrically aligned; and
    wherein the inner ring and outer ring are separated by an intermediate dark ring.

4. A method as recited in claim 3, wherein calculating the position of the optical feature comprises locating a center point of the dark ring.

5. A method as recited in claim 1, wherein the optical feature is transformed from a single point of light to the circular ring having a predetermined radius.

6. A method as recited in claim 1, further comprising:
filtering two-dimensional information to remove background and low frequency components.

7. A method as recited in claim 6, wherein said steps of filtering and transforming are performed simultaneously.

8. A method as recited in claim 6, wherein the biaxial crystal acts as a high-pass filter to filter the information optically.

9. A method as recited in claim 6, wherein said step of filtering removes fixed and slowly varying background.

10. A method as recited in claim 6:
wherein the transformed image comprises a fundamental wave and a vortex wave; and
wherein the fundamental wave is removed with a circular polarizer to remove the background component from the image.

11. A method as recited in claim 1, further comprising:
directing light associated with a second optical feature along the axis of the biaxial crystal;
conically refracting said light of the second optical feature to transform the image of said second optical feature to comprise second circular ring structure; and
calculating the position of the second optical feature with respect to the first optical feature by locating a center point associated with the second circular ring structure.

12. A method as recited in claim 11:
wherein the first optical feature is associated with a first surface;
wherein the second optical feature is associated with a second surface; and
wherein the positions of the first optical feature and second optical feature are calculated to determine the location of the first surface with respect to the second surface.

13. A method as recited in claim 12, wherein the first and second surfaces comprise semiconductor layers.

14. A method as recited in claim 11, wherein the first optical feature comprises a point, and the second optical feature comprises a circle.

15. A method as recited in claim 11, wherein the first optical feature comprises a first circle, and the second optical feature comprises a second circle larger than the first circle.

16. An apparatus for measuring the position of an optical feature, comprising:
a biaxial crystal positioned such that light associated with the optical feature strikes an input face of the biaxial crystal;
wherein the biaxial crystal is configured such that it conically refracts said light along an axis of the biaxial crystal;
wherein the biaxial crystal is further configured such that said light exits an output face of the biaxial crystal as a circular ring structure; and
an observation surface coupled along an optical path in communication with the output face;
wherein the observation surface is configured to allow location of the position of the optical feature by locating a center point associated with the circular ring structure.

17. An apparatus as recited in claim 16, wherein the observation surface comprises a microscope objective.

18. An apparatus as recited in claim 16, wherein biaxial crystal comprises one or more of the following materials: KTP, POM, BIBO, LAP, LBO, $KNbO_3$, DAST, MBANP, AANP, YCOB and KGW-MDT.

19. An apparatus as recited in claim 16, wherein the circular ring structure comprises Poggendorff rings.

20. An apparatus as recited in claim 16, wherein the circular ring structure comprises an inner ring and an outer ring;
wherein the inner ring and outer ring are concentrically aligned; and
wherein the inner ring and outer ring are separated by an intermediate dark ring.

21. An apparatus as recited in claim 20:
wherein the optical feature comprises a single light point, and
wherein the biaxial crystal is configured to optically accentuate position information the optical feature by transforming a single point of light to the circular ring structure having a predetermined radius.

22. An apparatus as recited in claim 16:
wherein the biaxial crystal is configured to operate as a high-pass filter to remove background and low frequency components.

23. A lithography system, comprising:
a laser configured to emit a beam of light along an optical path;
an optical element configured to focus the beam to a single point of light;
a biaxial crystal disposed along the optical path;
wherein the biaxial crystal is positioned such that an input face of the biaxial crystal coincides with point of light;
wherein the biaxial crystal is configured such that it conically refracts said light along an axis of the biaxial crystal;
wherein the biaxial crystal is configured such that said light exits an output face of the biaxial crystal as a circular ring structure; and
a Kohler plane disposed along the optical path; wherein the Kohler plane is configured to receive the exiting circular ring structure.

24. An apparatus as recited in claim 23, further comprising:
an imaging lens disposed between the output face and the Kohler plane;
wherein the imaging lens is configured to reimage circular ring structure in the Kohler plane.

25. An apparatus as recited in claim 24, wherein the imaging lens is configured to control the size and shape of the circular ring structure.

26. An apparatus as recited in claim 23, wherein the circular ring structure comprises Poggendorff rings.

27. An apparatus as recited in claim 23, further comprising:
an HOE disposed between the output face and the Kohler plane;
wherein the HOE is configured to adjust parameters of the circular ring structure image.

* * * * *

UNITED STATES PATENT AND TRADEMARK OFFICE
CERTIFICATE OF CORRECTION

PATENT NO. : 7,541,600 B2  Page 1 of 1
APPLICATION NO. : 11/488176
DATED : June 2, 2009
INVENTOR(S) : Daniel Neuhauser et al.

It is certified that error appears in the above-identified patent and that said Letters Patent is hereby corrected as shown below:

In the Specifications:

In Column 1, line 17, change "Not Applicable" to

--This invention was made with Government support under Grant No. 0312431 awarded by the National Science Foundation (NSF). The Government has certain rights in this invention.--

Signed and Sealed this
Twenty-third Day of April, 2013

Teresa Stanek Rea
*Acting Director of the United States Patent and Trademark Office*